United States Patent [19]

Hom

[11] Patent Number: 5,008,633
[45] Date of Patent: Apr. 16, 1991

[54] CROSS-FED FET POWER-CHIP
[75] Inventor: Harvey K. Y. Hom, Santa Monica, Calif.
[73] Assignee: ITT Corporation, New York, N.Y.
[21] Appl. No.: 502,077
[22] Filed: Mar. 29, 1990
[51] Int. Cl.$^5$ .................. H03F 3/193; H03F 3/68
[52] U.S. Cl. .................... 330/277; 330/53; 330/286; 330/295; 333/109
[58] Field of Search .................... 330/53–55, 330/124 R, 277, 295, 286; 333/109

[56] References Cited

FOREIGN PATENT DOCUMENTS 2648898  5/1978  Fed. Rep. of Germany ...... 330/295

Primary Examiner—James B. Mullins
Attorney, Agent, or Firm—Arthur L. Plevy; Patrick M. Hogan

[57] ABSTRACT

A cross-fed FET power-chip amplifier employing a plurality of stages each having two FET devices. Wide band four port directional couplers couple the stages, each having an input, and output and two driver input terminals. An input signal is connected to the input terminal and the coupler is designed to produce a majority of the output at the output terminal and a lesser output at each of the driver input which have a 90° phase relationship. Each driver input is connected to one gate of the two FET device, the sources of which are connected to common and the drains of which are connected together by a broadband 90° coupler to accommodate the 90° offset at the gates. The output of the broadband coupler is connected to the input terminal of the directional coupler of each subsequent stage and one or more combiners are coupled to the output terminals of the directional coupler of each stage and the broadband coupler of the final stage to drive an output signal. In a preferred embodiment, two preamplification stages are employed and ten subsequent stages of gallium arsenide FETs. Two five way combiners combine the outputs, one combining the outputs of the odd numbered directional couplers and the other the outputs of the even numbered directional couplers and the final stage broadband coupler. A two way combiner then combines the outputs of the five way combiners, the output of the two way combiner going to a isolator to provide stability for the amplifier under open load condition.

5 Claims, 3 Drawing Sheets

CROSS-FED FET POWER-CHIP

BACKGROUND OF THE INVENTION

1. Field of the Invention

The present invention relates to a cross-fed FET power-chip for use for example as a basic power amplifier in a distributed transmitter of an antenna array. More specifically, a power-chip is implemented in gallium arsenide reducing the number of components by employing broadband couplers and four port directional couplers between stages eliminating as many as fifty components per chip and employing combiners to combine the outputs of the stages, with a large percentage of the output of each stage going to the combiner and a smaller percentage going to the input of the next stage.

2. Description of the Prior Art

A prior art FET power amplifier such as shown in FIG. 1 achieves high RF power by combining ten cells, $S_1$–$S_{10}$, gate size 2.4 mm each. Each cell has internal input and output matching. The final part of the divider and combiner circuits is external to the chip in order to keep the physical size of the chip reasonable.

The disadvantages of the prior art device are inherently high cost, moderate band width and a low gain for the following reasons. Each input impedance matching network for the FET $F_1$ requires five elements, $L_0$, $L_2$, $L_4$, $C_1$ and $C_3$ or a total of fifty elements for ten cells. This configuration drives up the chip's size and cost for large volume production. The amplifier bandwidth is limited by the high transforming ratio, 1.5 ohms to 50 ohms. A low impedance ten way divider is needed at the input for drive distribution. Also the need for high input power level dictates a medium power driver for module application which makes parallel combining of chips exceedingly difficult.

Another prior art device is disclosed in U.S. Pat. No. 4,788,511, Schindler, Distributed Power Amplifier. In this device, each amplifier needs its own network which is then combined.

U.S. Pat. No. 4,514,699, Kariatsumari, et al., discloses a microwave power amplifier combiner composed of $p/2$ hybrid couplers which employ reflector type amplifiers different from the amplifiers of the subject invention.

U.S. Pat. No. 3,534,283 Seidel, employs a series of emitter follower amplifiers in which each stage drives the next, whereas the present invention derives power from each stage.

U.S. Pat. No. 3,919,685, Haill, Seismic Data Acquisition System, discloses an amplifier employing standard parallel combining by means of switching.

SUMMARY OF THE INVENTION

In the present invention a cross-fed FET power-chip amplifier is provided employing stages each having two FET devices with a wide band four port directional coupler between stages having an input terminal and an output terminal and two driver inputs. An input signal is provided to the input terminal of the directional coupler which is designed to produce the majority of the output at the output terminal and a lesser output at each of the two driver inputs which have a 90° phase relationship. The driver inputs are each connected to the gate of one of the FET devices. The sources of the FET devices are connected to common and the drains connected together by a broadband 90° coupler to accommodate the 90° offset at the gates. The output of the broadband coupler is connected to the input of the subsequent directional coupler going to the next stage. One or more combiners are employed with the outputs of the output terminals of the directional couplers and the broadband coupler of the final stage going to the combiners to combine them and thence to an isolator for providing stability under open load conditions.

In a preferred embodiment two preamplification stages are employed and two five way combiners are used, one to couple the outputs of the even numbered stages and the final stage broadband coupler and the other to couple the outputs of the odd numbered stages. A two way combiner then combines the outputs of the five way combiners and has an output going to the isolator through an impedance transformer.

The invention has the advantages of cost reduction, bandwidth improvement and high gain by removing technically difficult problems. For instance the five element input matching network to the FET shown in FIG. 1 is replaced with a simple four port coupler and a 2.4 mm FET is replaced with a pair of 1.2 mm FETs with no change in physical size. This arrangement eliminates five components per stage or fifty per chip. The coupler may provide 20% of the power to the FET input and 80% to the combiner.

Each pair of 1.2 mm FET amplifiers achieves wide band characteristics using a wide band four port coupler and driving two inputs of the FET at 90° phase relation.

The input distributing lo-way divider shown in FIG. 1 is eliminated by the cross-fed technique representing a saving in space and circuit loss. Also, the overall gain is 25 db higher because two stages of preamplifiers can be integrated conveniently.

DESCRIPTION OF THE PREFERRED EMBODIMENTS

Figure 1:
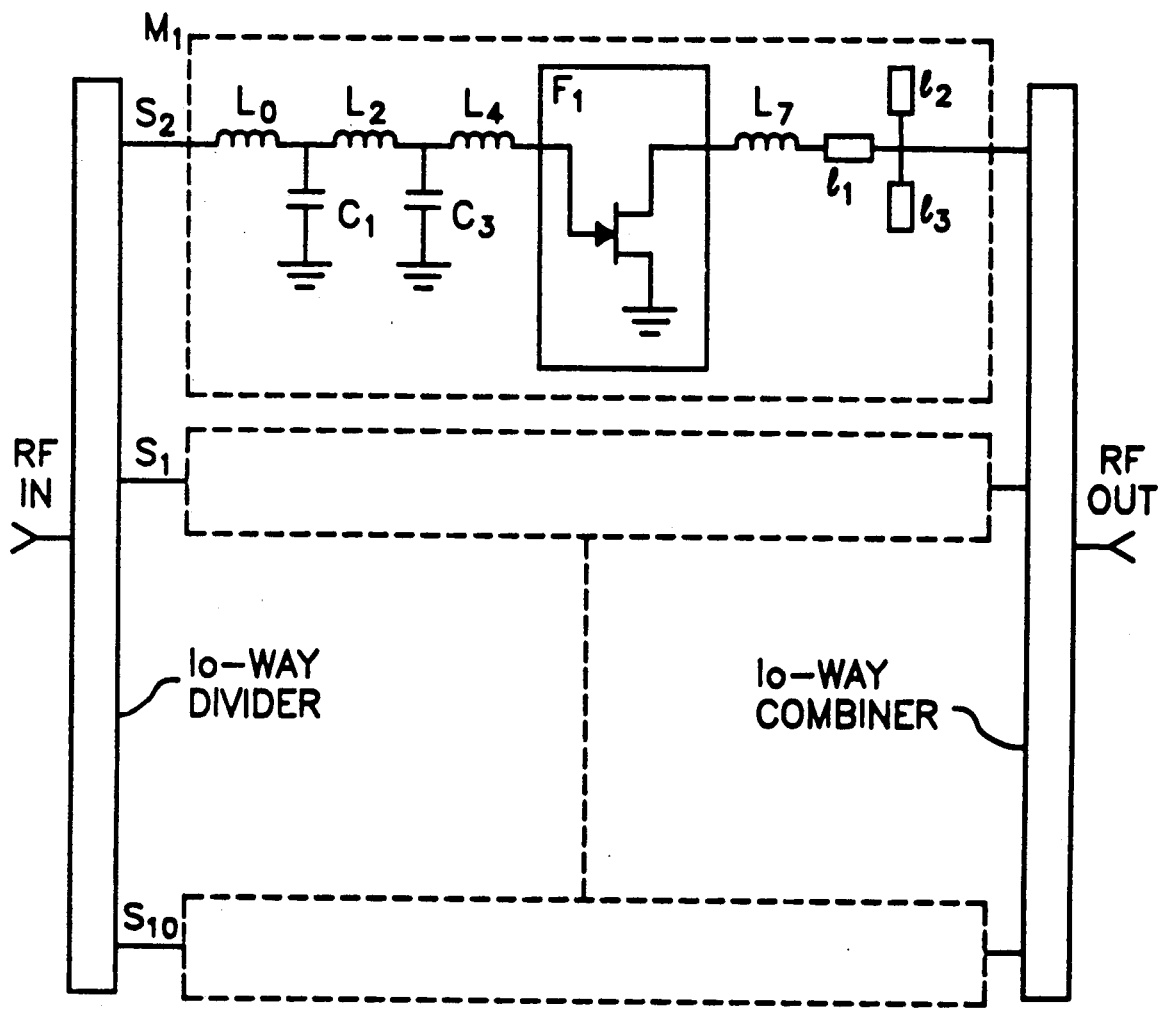
FIG. 1 is a circuit diagram of a prior art ten cell combining gallium arsenide FET amplifier.

The subject invention is primarily configured for MMIC although the basic principle can be applied to other types of mediums. The basic chip may have two stages of high gain preamplifiers and ten pairs of 1.2 mm FETs. Other major functional components are nine four port couplers, nine broadband couplers, two five way combiners and one two way combiner. The frequency of operation may be 4–8 GHz or 5–10 GHz, power output 14 watts, power gain 32 db and added power efficiency 30%. The five element input matching network employing components $L_0$, $L_2$, $L_4$, $C_1$ and $C_3$ of FIG. 1 is replaced with a simple four port coupler $N_1$ to $N_9$ shown in FIGS. 2 and 3 and the 2.4 mm FET $F_1$ shown in FIG. 1 is replaced with a pair of 1.2 mm FETs such as $F_{4a}$ and $F_{4b}$ or $F_{5a}$ and $F_{5b}$ shown in FIG. 2 with no change in physical size. This arrangement eliminates five components per stage or fifty per chip. The couplers $N_1$–$N_9$ provide 20% of the power to the FET inputs at the gates of $F_{4a}$ and $F_{4b}$, for example, and 80% of the power to the combiner on the output terminals 10, 12 and 13 of the couplers $N_1$, $N_2$ and $N_3$ shown in FIG. 2, for example. Each pair of 1.2 mm FET amplifiers in each stage achieves wide band characteristics by using a wide band four port directional coupler and driving the two inputs at the gate electrodes of the FET at 90° phase relation from the two driver input terminals 14 and 16 of the first stage of FIG. 2 and 18 and 20 of the second stage of FIG. 2 for example. The input distributing low way divider shown in FIG. 1 is eliminated by the cross-fed technique shown in FIG. 3 which represents a saving in space and circuit loss. Also the overall gain is 25 db higher because two stages of preamplifiers such as $F_1$, and $F_2$ of FIG. 3 can be integrated conveniently.

Figure 2:
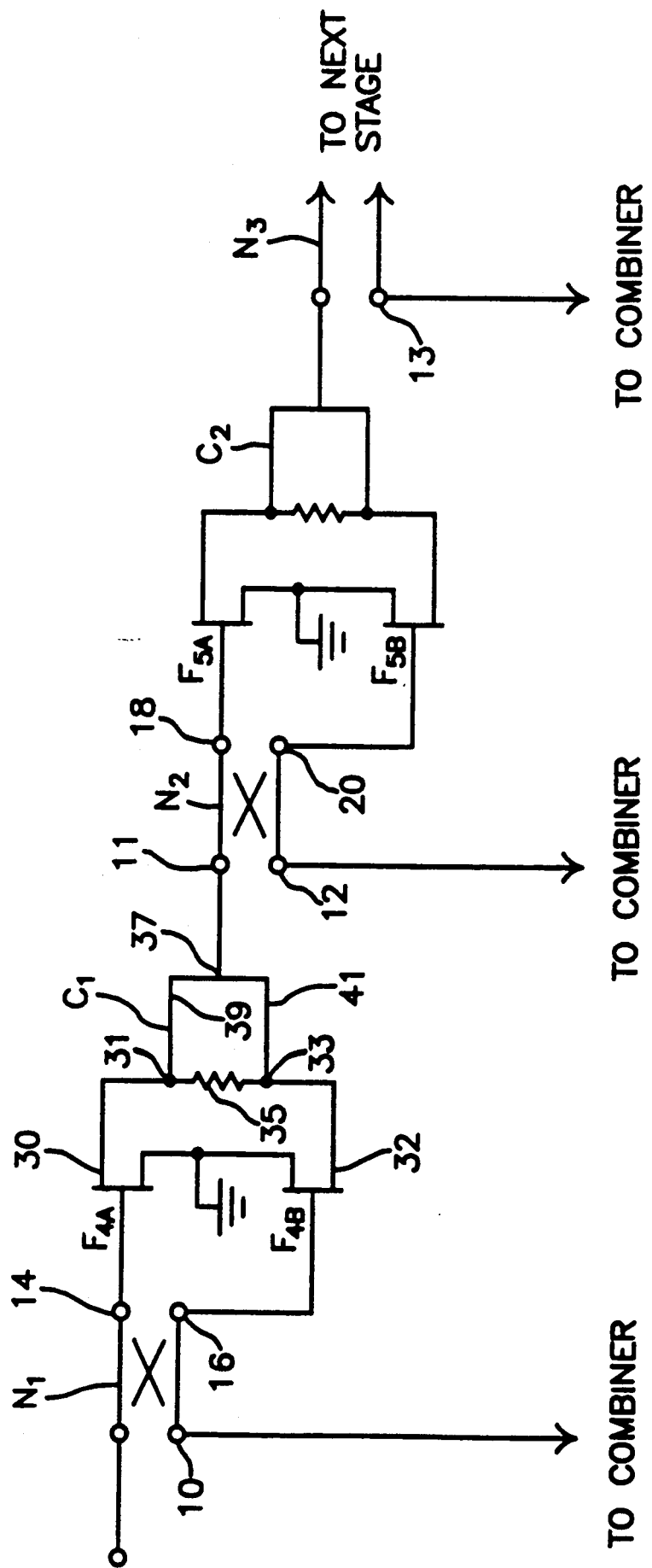
FIG. 2 is a circuit diagram illustrating two typical stages in the amplifier of the present invention.
Figure 3:
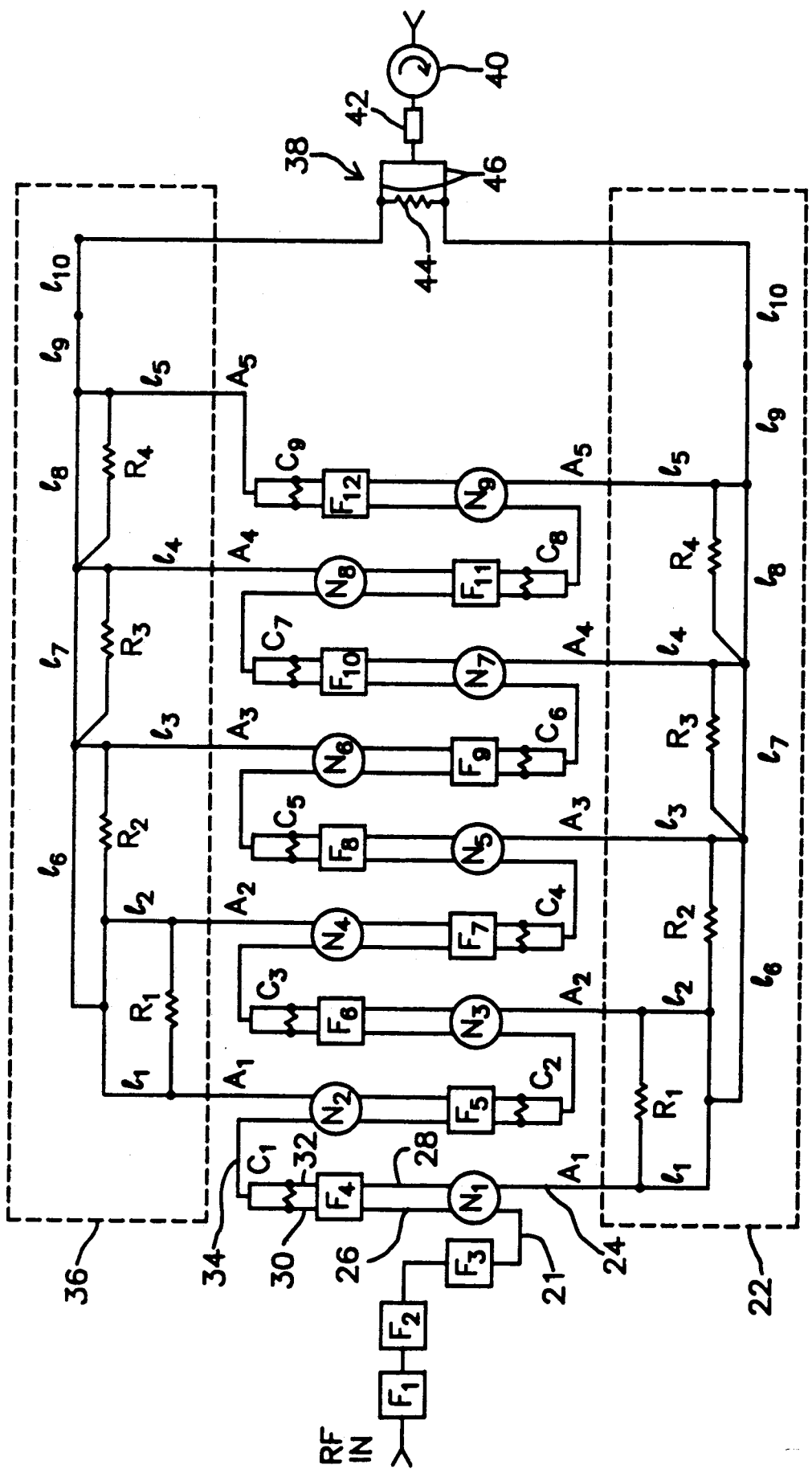
FIG. 3 is a block diagram showing a ten stage amplifier together with two five stage combiners and a two stage combiner in accordance with the present invention.

In the block diagram of the configuration shown in FIG. 3 for purposes of illustration the input signal may be 0.008 watts and the output 14 watts for a net power gain of 32 db. The first stage $F_1$ has a 10 db gain and is an industry standard low-noise amplifier design of gallium arsenide FETs employing high gain and broadband. The second stage amplifier $F_2$ has a 7 db gain and is also a standard design using gallium arsenide FETs with high gain, broadband and low-noise and employs a pair of 1.2 mm FETs. The output of $F_3$ is fed to the input terminal 21 of a four port coupler $N_1$ and the power is divided two ways with 20% feeding $F_4$ and 80% feeding the five way combiner 22 by way of the output terminal 24 on coupler $N_1$. $N_1$ is a microstrip coupler with low insertion loss and high isolation. $F_4$ is a pair of 1.2 mm FETs excited with a 90° offset signal from $N_1$ over the leads 26 and 28 from the two driver input terminals of the coupler $N_1$ at a 50 ohm output impedance. Each input to $F_4$ has an input impedance of 3j3 thus providing a very effective interface with the 50 ohm coupler to receive 20% of the power over a 50% bandwidth of special interest. There is no complicated high ratio transformer necessary at the input for proper matching. The two drains 30 and 32 from $F_4$ shown in FIG. 2 and FIG. 3 are connected to a broadband 90° coupler C1 to accommodate the 90° offset at the input. The drains are connected to opposite ends 31 and 33 of a resistor 35 across the input of coupler $C_1$ and the output 37 of $C_1$ is connected to the input 11 of directional coupler $N_2$. Coupler $C_1$ is a standard Wilkinson coupler with quarter wavelength lines 39 and 41 and serves the stated function of accommodating the 90° offset. The combined power is fed over the lead 34 to the input terminal of the directional coupler $N_2$ for further power distribution. Repetition of amplification at $F_4$ continues from $F_5$ through $F_{12}$. The outputs from $F_4$, $F_6$, $F_8$, $F_{10}$ and $F_{12}$ are fed to the upper five way combiner 36 and similarly the outputs from $F_3$, $F_5$, $F_7$, $F_9$, and $F_{11}$ are fed to the lower five way combiner 22. The final total power is collected by a two way combiner 38 from the two way five way combiners 22 and 36. The output of the two way combiner 38 is fed to a broadband isolator 40 to provide stability for the amplifier under open load conditions through an impedance transformer 42. Five way combiners 22 and 36 each employ four 50 ohm resistors $R_1$-$R_4$. Lines $l_1$-$l_5$ are 50 ohms each. The remaining lines $l_6 = 25$ ohms, $l_7 = 16.7$ ohms, $l_8 = 10$ ohms, $l_9 = 16$ ohms and $l_{10} = 35$ ohms. The inputs $A_1$-$A_5$ are of equal amplitude. At each junction, each voltage amplitude is added properly by virtue of the relationship of 50 ohm line and the main line. The phase at each junction is equal, because each amplifier is fed with a divider that has complementary phase of its five way combiner. Quarter wave transformers $l_9$ and $l_{10}$ are required for broadband transforming the network back to normal 50 ohm. $R_1$ through $R_4$ provide isolation for each amplifier. Two way combiner 38 employs a 50 ohm resistor 44 and two quarter wave microstrip lines 46.

The amplifier of the subject invention is suitable for basic power amplification in a distributed transmitter of an antenna array or a centralized transmitter. It also has broadband characteristics and is desirable for electronic counter measure applications. The device is also attractive for wide band communication systems.

Since the principles of the invention have now been made clear, modifications which are particularly adapted for specific situations without departing from these principles will be apparent to those skilled in the art. The appended claims are intended to cover such modifications as well as the subject matter described and to only be limited by the true spirit and scope of the invention.

What is claimed as new and desired to be secured by Letters Patent of the United States is:

I claim:

1. A cross-fed FET power-chip amplifier in which a first stage consists of two FET devices, each having a gate, a source and a drain; a wide band four port directional coupler having an input terminal, an output terminal and two driver inputs; means for connecting an input signal to said input terminal, said directional coupler being designed to produce the majority of its output at said output terminal and a lesser output in each of said two driver inputs which have a 90° phase relationship; means connecting each of said driver inputs to a gate of one of said FET devices; a broadband 90°. coupler having two inputs and an output with a resistor across its inputs; means connecting the sources of said FET devices to common and the drains of said FET devices each to one input of the broadband 90° coupler to accommodate the 90° offset at the gates; at least one subsequent stage configured the same as said first stage; means coupling the output of the broadband coupler to the input terminal of the directional coupler of the subsequent stage; at least one combiner; and means for coupling the output terminals of the directional couplers of each stage and the broadband coupler of the final stage to said at least one combiner to derive an output signal.

2. The amplifier of claim 1 including at least one preamplification stage and an amplification stage connected in series from an input signal to the input of said directional coupler of said first stage and wherein said amplification stage employs a pair of GaAs FET's.

3. The amplifier of claim 2 including a broadband isolator, means connecting the output of said combiners to said isolator to provide stability under open load condition.

4. The amplifier of claim 3 in which two preamplification stages are employed and ten subsequent stages of GaAs FETs including said amplification stage, two five way combiners, the outputs of odd numbered directional couplers being connected to the inputs of one of said five way combiners and the outputs of even numbered directional couplers and the final stage broadband coupler being connected to the inputs of the other five way combiner, a two way combiner having two inputs and an output, the outputs of said five way combiners each being connected to a different input of said two way combiner and the output of said two way combiner being connected to the input of said isolator.

5. The amplifier of claim 4 in which the output of the two way combiner is connected through an impedance transformer to the input of said isolator.

* * * * *